(12) United States Patent
Krause et al.

(10) Patent No.: US 9,954,139 B2
(45) Date of Patent: Apr. 24, 2018

(54) MULTIPLE TRANSFER ASSEMBLY PROCESS

(71) Applicants: Soitec, Crolles (FR);
Fraunhofer-Gesellschaft zur Förderung der angewandten Forschung e. V., München (DE)

(72) Inventors: Rainer Krause, Mainz-Kostheim (DE); Cecile Aulnette, Lumbin (FR); Eric Mazaleyrat, Crolles (FR); Frank Dimroth, Freiburg (DE); Eric Guiot, Goncelin (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/780,409

(22) PCT Filed: Mar. 26, 2014

(86) PCT No.: PCT/EP2014/056089
§ 371 (c)(1),
(2) Date: Sep. 25, 2015

(87) PCT Pub. No.: WO2014/154767
PCT Pub. Date: Oct. 2, 2014

(65) Prior Publication Data
US 2016/0043254 A1 Feb. 11, 2016

(30) Foreign Application Priority Data
Mar. 29, 2013 (FR) .................... 13 52867

(51) Int. Cl.
*H01L 33/00* (2010.01)
*H01L 21/67* (2006.01)
(Continued)

(52) U.S. Cl.
CPC .... *H01L 33/0079* (2013.01); *H01L 21/67092* (2013.01); *H01L 21/6835* (2013.01);
(Continued)

(58) Field of Classification Search
CPC . H01L 31/047; H01L 31/024; H01L 31/1892; H01L 31/028; H01L 31/0304;
(Continued)

(56) References Cited

U.S. PATENT DOCUMENTS 4,590,667 A 5/1986 Simon
4,691,075 A 9/1987 Murphy
(Continued)

FOREIGN PATENT DOCUMENTS

CN 102576778 A 7/2012
CN 1873850 A 12/2016
(Continued)

OTHER PUBLICATIONS

French Preliminary Search Report for French Application No. 1352867 dated Dec. 18, 2013, 7 pages.
(Continued)

*Primary Examiner* — Jeffrey T Barton
*Assistant Examiner* — Michael Y Sun
(74) *Attorney, Agent, or Firm* — TraskBritt

(57) ABSTRACT

This disclosure is related to a manufacturing method for a plurality of photovoltaic cells comprising the steps of: obtaining a plurality of photovoltaic cells placed at a first distance from each other; attaching a stretching material to the plurality of photovoltaic cells; and stretching the stretching material such that the plurality of photovoltaic cells result at a second distance from each other, wherein the second distance is greater that the first distance.

13 Claims, 6 Drawing Sheets

(51) Int. Cl.
*H01L 21/683* (2006.01)
*H01L 31/18* (2006.01)
*H01L 31/02* (2006.01)
*H01L 31/028* (2006.01)
*H01L 21/762* (2006.01)
*H01L 31/047* (2014.01)
*H01L 31/024* (2014.01)
*H01L 31/0304* (2006.01)

(52) U.S. Cl.
CPC .... *H01L 21/6836* (2013.01); *H01L 21/76251* (2013.01); *H01L 31/02008* (2013.01); *H01L 31/028* (2013.01); *H01L 31/1876* (2013.01); *H01L 31/1892* (2013.01); *H01L 21/76254* (2013.01); *H01L 21/76275* (2013.01); *H01L 31/024* (2013.01); *H01L 31/0304* (2013.01); *H01L 31/047* (2014.12); *H01L 2221/68345* (2013.01); *H01L 2221/68359* (2013.01); *H01L 2221/68363* (2013.01); *H01L 2221/68368* (2013.01); *H01L 2221/68386* (2013.01); *H01L 2223/54426* (2013.01); *Y02E 10/50* (2013.01); *Y02P 70/521* (2015.11)

(58) Field of Classification Search
CPC .......... H01L 31/02008; H01L 31/1876; H01L 33/0079; H01L 21/6836; H01L 21/6835; H01L 21/67092; H01L 21/76251; H01L 2223/54426; H01L 2221/68368; H01L 2221/68386; H01L 2221/68345; H01L 2221/68363; H01L 2221/68359; H01L 21/76254; H01L 21/76275; Y02P 70/521; Y02E 10/50
See application file for complete search history.

(56) References Cited

U.S. PATENT DOCUMENTS

| | | | |
|---|---|---|---|
| 5,362,671 A * | 11/1994 | Zavracky | A61B 3/113 148/DIG. 150 |
| 7,910,822 B1 * | 3/2011 | Funcell | H01L 31/18 136/244 |
| 2006/0270236 A1 | 11/2006 | Kusumoto et al. | |
| 2007/0004082 A1 | 1/2007 | Tsurume et al. | |
| 2009/0223555 A1 * | 9/2009 | Ammar | H01L 31/0543 136/246 |
| 2010/0116942 A1 * | 5/2010 | Fitzgerald | H01L 31/02167 244/172.7 |
| 2010/0233843 A1 * | 9/2010 | Frolov | H01L 31/03529 438/98 |
| 2010/0251618 A1 | 10/2010 | Nishikawa et al. | |
| 2011/0023958 A1 | 2/2011 | Masson et al. | |
| 2011/0162704 A1 * | 7/2011 | Le | C23C 14/083 136/256 |

FOREIGN PATENT DOCUMENTS

| | | | |
|---|---|---|---|
| KR | 20100104068 A | 9/2009 | |
| WO | 2011123285 A1 | 10/2011 | |
| WO | WO 2011123285 A1 * | 10/2011 | ......... H01L 21/6835 |

OTHER PUBLICATIONS

International Search Report for International Application No. PCT/EP2014/056089 dated May 28, 2014, 4 pages.
Chinese Office Action for Chinese Application No. 201480030562.9 dated Jul. 6, 2016, 11 pages.
International Preliminray Report on Patentability for International Application No. PCT/EP2014/056089 dated Sep. 29, 2016.
International Written Opinion for International Application No. PCT/EP2014/056089 dated May 28, 2014, 5 pages.
Chinese First Search for Chinese Application No. 201480030562.9, dated May 25, 2016, 3 pages.
Chinese Second Office Action for Chinese Application No. 201480030562.9, dated Feb. 16, 2017, 10 pages.

* cited by examiner

MULTIPLE TRANSFER ASSEMBLY PROCESS

CROSS-REFERENCE TO RELATED APPLICATIONS

This application is a national phase entry under 35 U.S.C. § 371 of International Patent Application PCT/EP2014/056089, filed Mar. 26, 2014, designating the United States of America and published in English as International Patent Publication WO 2014/154767 A1 on Oct. 2, 2014, which claims the benefit under Article 8 of the Patent Cooperation Treaty and under 35 U.S.C. § 119(e) to French Patent Application Serial No. 1352867, filed Mar. 29, 2013, the disclosure of each of which is hereby incorporated herein in its entirety by this reference.

TECHNICAL FIELD

This disclosure relates to the field of photovoltaic cells. In particular, it relates to a manufacturing method for a plurality of photovoltaic cells such that the cells can be moved from a first position in which they are separated from each other by a first distance, to a second position in which they are separated from each other by a second distance greater than the first distance, in a fast and economical manner.

BACKGROUND

In recent years, due to the constant increase of energy prices dictated, in particular, by the constant increase in the price of fossil fuels, more and more interest has been shown toward renewable energy sources. One particularly appreciated form of renewable energy consists of photovoltaic energy, which can be installed virtually anywhere in sizes ranging from a few square centimeters to photovoltaic parts covering several square kilometers.

One particularly advantageous form of photovoltaic generators consists of III-V concentrator generators. Even more specifically, multi-junction III-V concentrator photovoltaic cells are preferred since they can achieve much higher efficiencies compared to the standard silicon technology. In the concentrator photovoltaic module, the size of the photovoltaic cells is reduced thanks to the use of a lens focusing light from a larger area to a smaller area, corresponding to the smaller size of the photovoltaic cells. This implies that the photovoltaic cells do not cover the entire area of the module, but are rather spaced from each other. Depending on the concentration of the light, the use of a heat sink might be necessary in order to avoid efficiency losses due to increased temperature of the photovoltaic cells. Therefore, when realizing the module, it is a standard approach to pick and place each of the cells, at a certain distance from each other, for instance, on top of the heat sink as part of the concentrator photovoltaic module.

Such a standard approach is illustrated in FIG. 6. In particular, FIG. 6 illustrates a plurality of cut views of the product during different steps of the manufacturing process. A substrate 8130 is provided on which, during a step S81, a photovoltaic layer 8120 is provided. For instance, the photovoltaic layer 8120 could be grown by epitaxial growth of III-V semiconducting materials like indium gallium phosphide and gallium arsenide on, for example, a germanium wafer, leading to a common multi junction solar cell of type InGaP/GaAs/Ge. The germanium wafer could typically have a diameter of 4, 6, or 8 inches. The photovoltaic layer 8120 could further include an anti-reflective coating and metal contacts on the front and/or rear side. During a step S82, the photovoltaic layer 8120 is cut so as to realize a plurality of photovoltaic cells 8121-8124 separated from each other. The substrate 8130 has to serve as a stabilizing support for the photovoltaic layer 8120. In the case of the above-mentioned InGaP/GaAs/Ge multi junction layer, the photovoltaic layer 8120 comprising the germanium wafer and the epitaxially grown semiconducting layers are provided on an adhesive foil, in particular, a typically blue foil with adhesive, which reduces adhesion after UV exposure, acting as substrate 8130 in order to maintain the positions of the photovoltaic cells 8121-8124 after cutting/separation. The germanium wafer has to have a minimum thickness in order to allow a subsequent pick and place of the cells. Part of that germanium wafer forms the bottom junction of the InGaP/GaAs/Ge multi-junction, whereas the rest of the Germanium substrate acts as stiffener for the separated photovoltaic cells. Such a separation or cut could be achieved by etching, diamond cut, sawing, laser separation, or any other technique used in the field of photovoltaic manufacturing and, more generally, semiconductor technology. During a step S83, the photovoltaic cells 8121-8124 are picked and placed, one by one, from substrate 8130 onto a heat sink 8140, thereby realizing structure 8101. Thereby the application of conductive glue or solder 8131-8134 is necessary in order to secure each individual photovoltaic cell on the heat sink 8140. One could also imagine several individual heat sinks 8140 for each individual photovoltaic cell 8121-8124. Heat sinks could be made of copper, aluminum or other metals and contain further elements like bypass diodes or contact pads. Structure 8101 can thereafter be placed into a module, with the addition of a lens layer (not illustrated), above the cells 8121-8124.

Such an approach is, however, slow and expensive, mainly due to the fact that the photovoltaic cells 8121-8124 have to be singularly, one by one, picked and placed from substrate 8130 to heat sink 8140. The pick-and-place process can be manual, or automated, but it remains a serial process, which is complicated and slow. The process does not allow all cells on one wafer to be processed simultaneously. Further, a sort of pick-and-place process has been developed by Semprius, as disclosed in WO2011/123285A1, and can be used to transfer a multiple number of cells by selectively bonding widely spaced cells from one wafer and releasing them to another structure at their initial separation distance. In this process, not all the cells from the starting wafer are processed simultaneously, neither a change of their distance separating them from each other is disclosed.

Additionally, the pick and pick-and-place approach is not satisfactory since the cells have to be manufactured with a certain thickness to provide sufficient stiffness in order to be manipulated. Further, in case of the common InGaP/GaAs/Ge cells, the initial thick Germanium substrate is rather expensive. Further, thick layers of the photovoltaic layer 8120 can cause losses due to high resistance for current and/or heat conduction. Thin layers with sufficient conductivity are preferred to minimize such losses. A thick layer of solder or conductive glue 8131-8134 is used to connect the semiconductor layers 8121-8124 to the heat sink 8140. Also, this layer causes additional resistance losses and leads to concerns of reliability due to different thermal expansion and corrosion, which can damage the interconnect over time.

BRIEF SUMMARY

It is, therefore, an object of this disclosure to provide a solution to these problems, thereby lowering costs and/or increasing production speed of photovoltaic modules. In other terms, it is an objective to provide an automated method for expanding distributed cells from a wafer of size A to a distributed configuration on a wafer of size B, where B>A, for instance, from 4 to 8 inches or from 6 to 12 inches.

This disclosure can relate to a manufacturing method for a plurality of photovoltaic cells comprising the steps of: obtaining a plurality of photovoltaic cells, placed at a first distance from each other; attaching a stretching material to the plurality of photovoltaic cells; and stretching the stretching material such that the plurality of photovoltaic cells results at a second distance from each other, wherein the second distance is greater than the first distance.

This provides the beneficial advantage that the cells can be moved away simultaneously from each other to a second distance, with a simple and parallel process.

In some embodiments, the manufacturing method can further comprise the step of positioning the plurality of photovoltaic cells onto a target substrate, while the cells are still attached to the stretching material, after the step of stretching.

This provides the beneficial advantage that the stretching material can be used not only for displacing the cells away from each other, but also for carrying them onto the target substrate and for precisely positioning them onto the target substrate.

In some embodiments, the manufacturing method can further comprise the step of assembling the plurality of photovoltaic cells to the target substrate after the step of positioning; and removing the stretched material from the plurality of photovoltaic cells after the step of assembling.

This provides the beneficial advantage that the cells can be firmly kept in place and stabilized mechanically, during the assembling step, by the stretching or stretched material.

In some embodiments, the manufacturing method can further comprise the step of removing the stretched material from the plurality of photovoltaic cells after the step of positioning; and assembling the plurality of photovoltaic cells to the target substrate after the step of removing.

This provides the beneficial advantage that the assembling is facilitated, since access to the cells is improved by the removing of the stretched stretching material before assembling.

In some embodiments, the plurality of photovoltaic cells can be obtained from a wafer of size A and the target substrate can be a wafer of size B greater than size A, and the plurality of photovoltaic cells can be attached to the stretching material and stretched from the initial size A of value 2 inches, 4 inches, 6 inches, or 8 inches to a respective larger size B of value 4 inches, 6 inches, 8 inches, or 12 inches.

This provides the beneficial advantage that the manufacturing of solar cell assemblies is facilitated using standard sizes of wafer for both the initial substrate and the target substrate, commonly used in semiconductor technology and, thus, easily implemented in currently existing production lines.

In some embodiments, the step of assembling can comprise bonding, in particular, direct bonding or metal bonding to the target substrate.

This provides the beneficial advantage that an improved electrical and thermal connection can be achieved between the cells and the target substrate.

In some embodiments, the assembling step can further comprise bond preparation steps, in particular, the deposition of conductive glue or the deposition of an adhesive and/or conductive intermediate layer on at least one of the plurality of photovoltaic cells or the target substrate, or surface preparation by a plasma treatment or a chemical mechanical polishing prior to bonding.

This provides the beneficial advantage that an improved bonding relative to its strength and quality is obtained.

In some embodiments, the target substrate can be a semiconductor substrate and can comprise contacts to the plurality of photovoltaic cells.

This provides the beneficial advantage that subsequent connections to the cell can be done via connections to the target substrate, on which bigger contacts may be provided, than on the cells themselves, thereby facilitating the realization of connections such as wirebond connections.

In some embodiments, the manufacturing method can further comprise the step of cutting the target substrate so as to realize a plurality of solar cell assemblies, each solar cell assembly comprising one of the pluralities of photovoltaic cells.

This provides the beneficial advantage that the solar cell assemblies can be subsequently placed onto another structure, such as a heat sink or a base plate of a module. Since the solar cell assemblies have bigger dimensions compared to the photovoltaic cells, handling of the former is easier compared to handling of the latter.

In some embodiments, the manufacturing method can further comprise the step of assembling the plurality of solar cell assemblies on a heat sink.

This provides the beneficial advantage that the heat generated in the cells can be dissipated.

In some embodiments, the photovoltaic cells can be multi-junction III-V concentrator photovoltaic cells.

This provides the beneficial advantage that efficiency of the cells can be increased.

In some further embodiments, the multi junction III-V concentrator photovoltaic cells can be provided or formed on a semiconductor substrate, in particular, GaAs, InP, Ge or Si, and the manufacturing method can further comprise removal of the substrate and separation of the photovoltaic cells.

This provides the beneficial advantage that the stretching process can be implemented in the manufacturing process of the III-V concentrator photovoltaic cells, the removal of the expensive substrates permits to reduce costs as these substrates could be reused for subsequent manufacturing processes of other cells.

In some further embodiments, the multi junction III-V concentrator photovoltaic cells can have a thickness of several micrometers, in particular, below 10 μm.

This provides the beneficial advantage that even very thin photovoltaic cell layers can be transferred, reducing the electrical losses due to normally rather thick substrates kept for stiffening reasons and, thus, also further reducing costs concerning the providing of such substrates.

Further, this disclosure can relate to a semiconductor structure comprising a stretched material attached to a plurality of photovoltaic cells such that the plurality of photovoltaic cells result at a second distance from each other, wherein the second distance is greater than a first distance that separates the plurality of photovoltaic cells from each other when the stretched material is not stretched.

In some embodiments, the stretching material can be made of metallic material at the position where the plurality of photovoltaic cells are attached.

This provides the beneficial advantage that the thus-obtained semiconductor structure can represent a multi-junction solar cell bonded to a stretching material representing a final heat sink material.

BRIEF DESCRIPTION OF THE DRAWINGS

The disclosure will now be described in more detail by way of example hereinafter, using advantageous embodiments and with reference to the drawings. The described embodiments are only possible configurations in which the individual feature may, however, as described above, be implemented independently of each other, or may be omitted, or may be combined between different embodiments. Equal elements illustrated in the drawings are provided with equal reference signs. Part of the description relating to equal elements illustrated in the different drawings may be left out. In the drawings.

DETAILED DESCRIPTION

Figure 1:
FIGS. 1 to 3 schematically illustrate steps of a manufacturing method for a plurality of photovoltaic cells in accordance with an embodiment of this disclosure.
Figure 1:
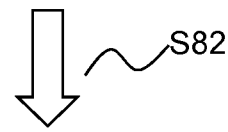
Figure 1:
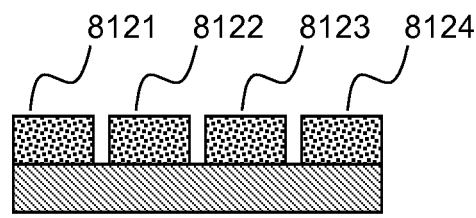
Figure 1:
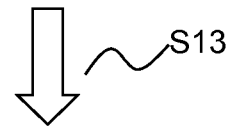
Figure 1:
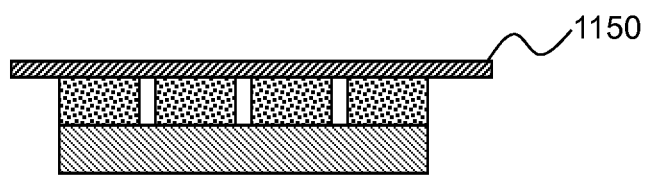
Figure 1:
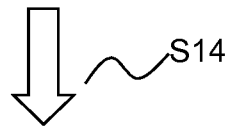
Figure 1:
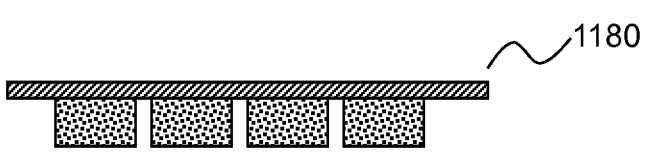
Figure 2:
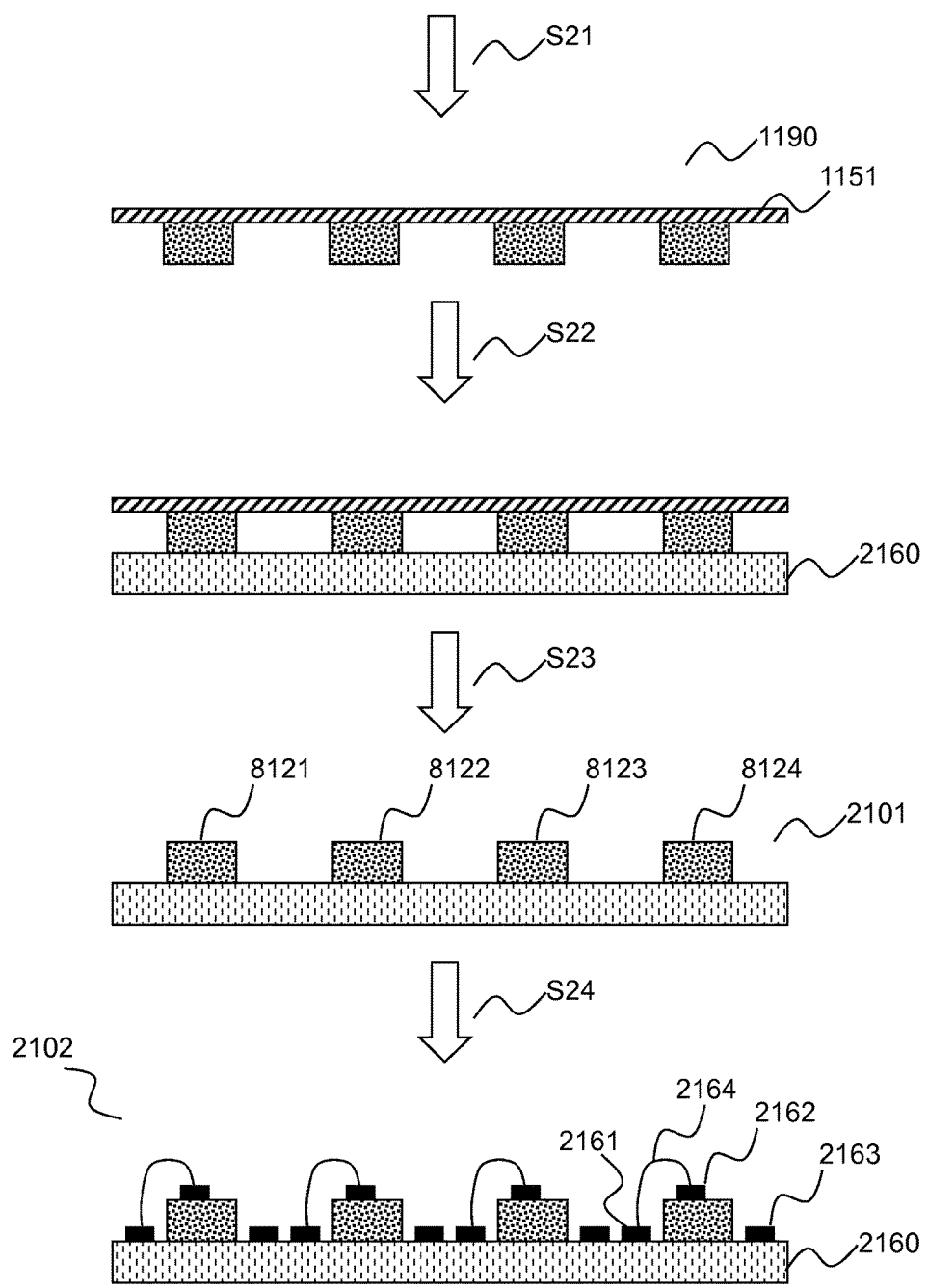
Figure 3:
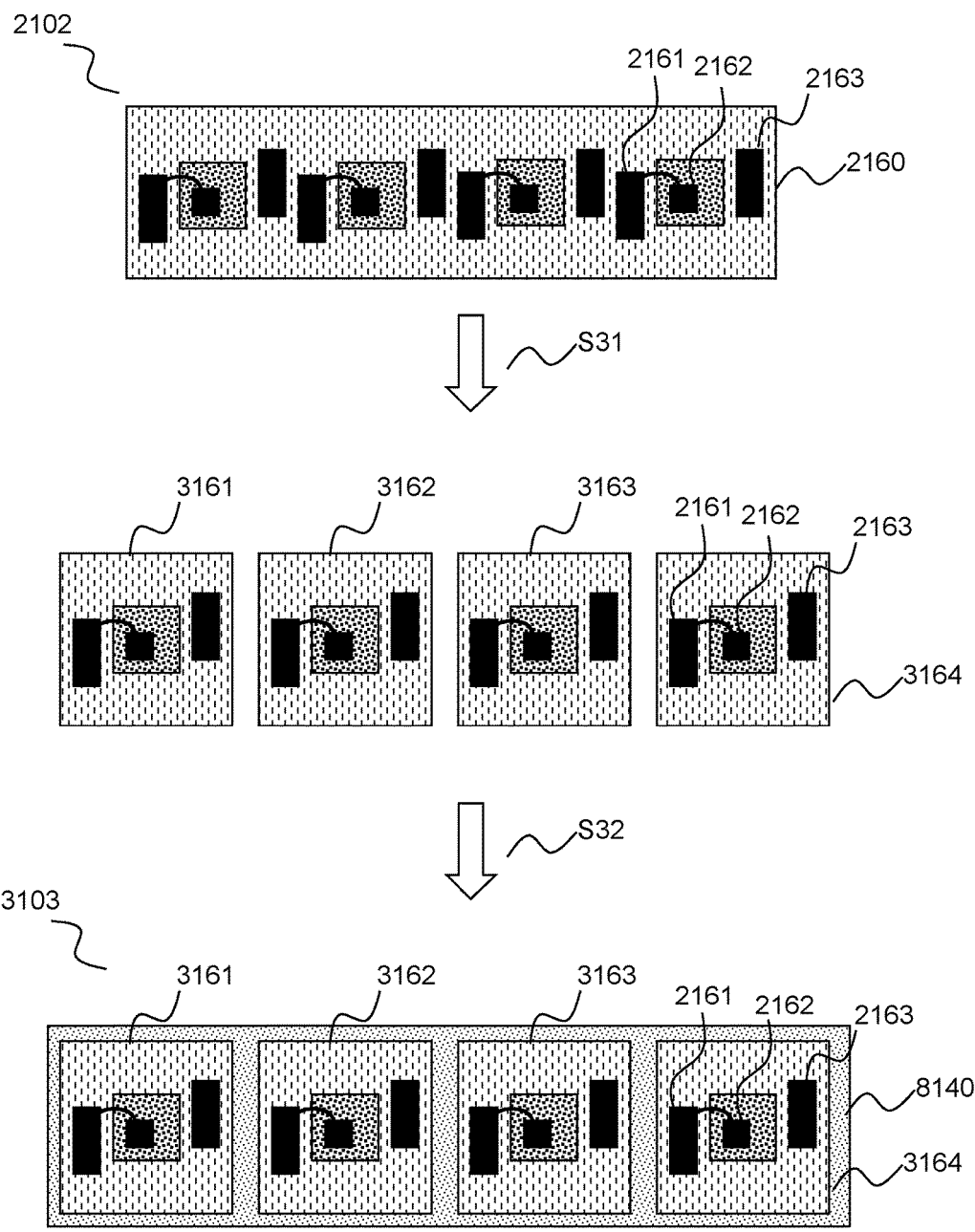

FIGS. 1 to 3 schematically illustrate a manufacturing method for a plurality of photovoltaic cells in accordance with an embodiment of this disclosure.

Figure 6:
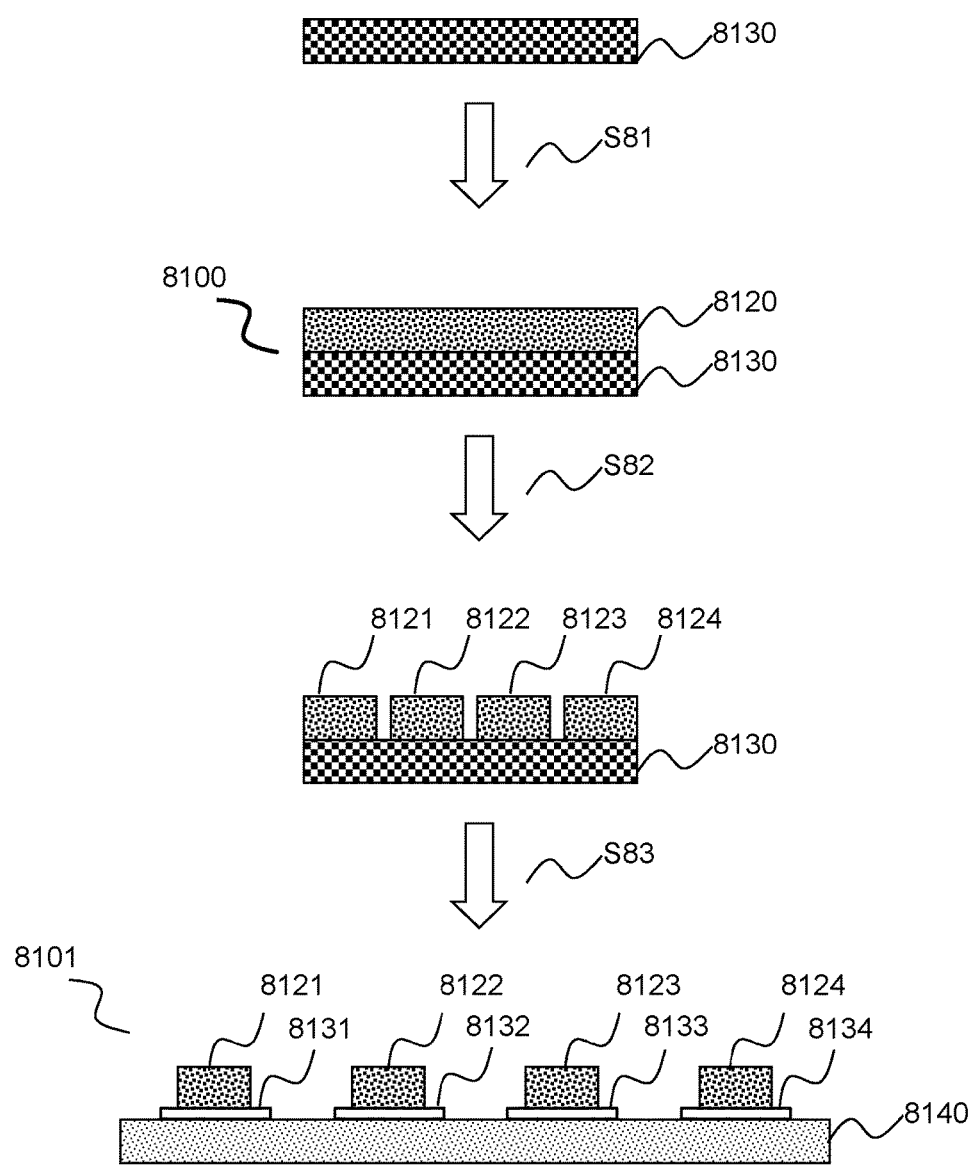
FIG. 6 schematically illustrates a manufacturing method for a solar cell assembly in accordance with the state of the art.

Similar to what has been described with respect to FIG. 6, a photovoltaic layer 8120 is provided on a substrate 8130, thereby forming the structure 8100. The substrate may be an adhesive foil as illustrated schematically in FIG. 1 or even a conventional gallium arsenide, indium phosphide or germanium wafer on its own, with a typical diameter of 4 inches, 6 inches, or 8 inches. The photovoltaic layer 8120 may include an anti-reflective coating and metal contacts on the front and/or rear side.

After a step S82 is realized on the structure 8100, as already illustrated schematically in FIG. 6, the photovoltaic layer 8120, which has been provided on the substrate 8130, is cut, thereby resulting in the plurality of photovoltaic cells 8121-8124 available on top of substrate 8130. During a placement step S13, stretching material 1150 is applied on top of photovoltaic cells 8121-8124. The stretching material 1150 is made of polymer and/or metal and/or other materials, which allow expansion by application of mechanical force, pressure or heat. For instance, one could use a thick material that expands, for example, thermally by heating. The stretching material is attached to the photovoltaic cells 8121-8124 by using a non-permanent adhesive like UV-glue, thermal glue or electrostatic force. After application of the stretching material 1150, during a step S14, the substrate 8130 is removed, thereby leaving photovoltaic cells 8121-8124 placed at a first distance from each other attached to the bottom side of stretching material 1150, thereby forming unstretched structure 1180. In contrast to the standard pick-and-place approach described with respect to FIG. 6, the photovoltaic cells 8121-8124 have no minimum thickness required for the embodiments of this disclosure. The photovoltaic cells can, for instance, be formed on the above-mentioned types of gallium arsenide (GaAs), indium phosphide (InP) or germanium (Ge) wafers as substrate 8130, for instance, by epitaxial growth or bonding techniques, and where the substrate 8130 is finally removed in step S14. For example, in accordance with this disclosure, in the case of an InGaP/GaAs/Ge multi junction cell, one could also remove the part of the germanium substrate wafer that is used for stiffening purposes that allowed a pick-and-place process. It becomes clear from FIG. 1 that the unstretched structure 1180 can also be obtained by the application of the stretching material 1150 on the initial structure 8100, removal of substrate 8130 and subsequent separation/cutting of the cells. In a further step, the stretching material 1150 and the unstretched structure 1180 are stretched during a stretching step S21, thereby resulting into stretched material 1151 and stretched structure 1190. In particular, during the stretching step S21, the lateral dimension of the stretching material 1150 is increased by stretching the stretching material 1150 into at least one direction. This results in the distance between each of the cells 8121-8124 increasing in the at least one direction in which the stretching material 1150 is stretched. Thanks to this step, the cells can be moved apart from each other at a predetermined second distance in accordance with the amount of lateral stretching exerted on the stretching material 1150, in a parallel and simultaneous manner, without having to move each single cell independently in a serial manner. Thanks to such an approach, the manufacturing method described above results in a faster production and/or in a more economical production of a photovoltaic module. In other words, instead of the serial processing of picking and placing each of the cells one by one from a first position in which they are close to each other to a second position in which they are separated from each other, such separation is achieved, in parallel, for all cells at once, thanks to the usage of stretching material 1150.

During a positioning step S22, the plurality of photovoltaic cells 8121-8124 are positioned on top of an optional semiconductor substrate 2160. Alternatively, at this step, the cells 8121-8124 could be placed on top of a heat sink 8140, secured by means of gluing and/or welding, and the stretched material 1151 is removed, thereby resulting into structure 8101. In both cases, the semiconductor substrate 2160 or the heat sink 8140 acts as a target substrate for the assembling of the cells 8121-8124.

If the cells 8121-8124 are placed on optional semiconductor substrate 2160, they can be assembled by means of gluing, soldering and/or welding, in particular, laser welding and/or bonding, in particular, direct bonding or metal bonding, and/or any other suitable process. Semiconductor substrate 2160 could be any of a silicon molybdenum wafer, or Si, SiGe, Ge, Si on Mo, SiAl, Si on SiAl, etc. During a removal step S23, the stretched material 1151 is removed, e.g., by UV exposure, heat, chemicals, solvents, mechanical force, releasing electrostatic charge, and the cells 8121-8124 are left assembled to the semiconductor substrate 2160, forming structure 2101. During a patterning step S24, contacts 2161-2163, as well as wirebond connection 2164, are realized on semiconductor substrate 2160, as well as the plurality of cells 8121-8124. In particular, a front side contact 2161 is connected to a front cell contact 2162 placed on top of each of cells 8121-8124 via wirebond connection 2164, while a back side contact 2163 is electrically connected to the backside of each of cells 8121-8124 via a conducting path through the semiconductor substrate 2160. In case of other types of target substrates, the back contact could be formed by metal deposition of a contact pad prior to positioning and assembling of the photovoltaic cells in order to electrically relay each of the back side contacts 2163 to each back of the photovoltaic cells. This results in structure 2102, thereby containing a plurality of cells 8121-

8124 with the respective electrical contacts 2161-2163 to the front and to the back side of each of the cells.

In both cases where the cells 8121-8124 are placed on a heat sink 8140 or on a semiconductor substrate 2160, the use of the stretching material 1150 as a stretching element and as a positioning element is advantageous in simplifying the manufacturing process. In particular, the stretching material 1150 is first used as a stretching element in order to separate the cells 8121-8124 during stretching step S21 and, then, further subsequently used as a structural element in positioning the cells 8121-8124 on their target position during positioning step S22. Thanks to this dual usage of the stretching material 1150, the handling of the cells 8121-8124 is further simplified.

As described above, positioning step S22 can be carried out by keeping the connection between the stretched material 1151 and the cells 8121-8124, while the cells are assembled onto heat sink 8140 or on semiconductor substrate 2160. However, this disclosure is not limited thereto and positioning step S22 can alternatively be carried out by using the stretched material 1151 for positioning the cells 8121-8124 onto the target substrate, removing the stretched material 1151 before assembling the cells onto the target substrate, while leaving the cells on their respective position on the target substrate, and then proceeding to securing the cells onto the target substrate. In the latter case, the cells can be kept in position by several ways, such as by gluing, magnetic or electrostatic attraction, or simply by friction.

While FIG. 2 schematically illustrates a cut view of the structures during the manufacturing steps S21-S24, FIG. 3 schematically illustrates a top view of the structures. In particular, at the top of FIG. 3, structure 2102 is schematically illustrated. In particular, although structure 2102 may, in some embodiments, be a circular wafer, to ease representation, only a rectangular section of it is represented in FIG. 3. During a cutting step S31, semiconductor substrate 2160 is cut, thereby resulting in a plurality of semiconductor structures 3161-3164, each supporting a single photovoltaic cell, respectively, cells 8121-8124, and the corresponding electrical connections. The semiconductor structures 3161-3164, therefore, act as solar cell assemblies, providing a mechanical support for the cells 8121-8124, as well as electrical connection to the front and back side of the cells. During an assembling step S32, the plurality of solar cell assemblies can then be placed on top of a heat sink 8140 as illustrated by step S32, thereby realizing structure 3103. In alternative embodiments, individual heat sinks are also possible for each solar cell assembly.

Alternatively, or in addition, although not illustrated, each of semiconductor structures 3161-3164 may further comprise other circuits or functionalities for, and connections to, the photovoltaic cell on the semiconductor structure and to the neighboring structures. For instance, any of semiconductor structures 3161-3164 could further comprise a bypass diode for the photovoltaic cell. Alternatively, or in addition, front side contact 2161 could be realized directly on top of the photovoltaic cell, and not on the semiconductor structure and, thus, front cell contact 2162 is replaced. Further alternatively, or in addition, front side contact 2161 of a given cell could be connected to back side contact 2163 of the neighboring cell, so as to realize a series connection between the two photovoltaic cells. A parallel connection between two photovoltaic cells can be obtained connecting the respective front side contacts 2161 of each cell.

Moreover, although the embodiment has been described with reference to structure 8100 and steps S82, S13 and S14, any process that will result in the placement of a plurality of cells 8121-8124 onto a stretching material 1150 can be used instead, as a basis for the subsequent stretching step S21 and placement of the separated cells onto a target substrate.

In some embodiments, the photovoltaic cell can have lateral dimensions in a range from 1 $mm^2$ to 5 $cm^2$, preferably a value of 2 $mm^2$ to 20 $mm^2$, while the semiconductor structures 3161-3164 can have lateral dimensions in a range from 4 $mm^2$ to 2500 $mm^2$, preferably a value of 9 $mm^2$ to 1 $cm^2$. In some embodiments, the stretching can separate cells between 0.5 mm to 1 cm, preferably 1.5 mm to 5 mm from a wafer of size A to a wafer of size B larger than A.

Additionally, the contacts 2161-2163 are only schematically represented and could be realized with several shapes. For instance, front cell contact 2162 on the cells 8121-8124 could be advantageously realized as a contact grid with minimum shadowing in the middle of the cell.

Figure 4:
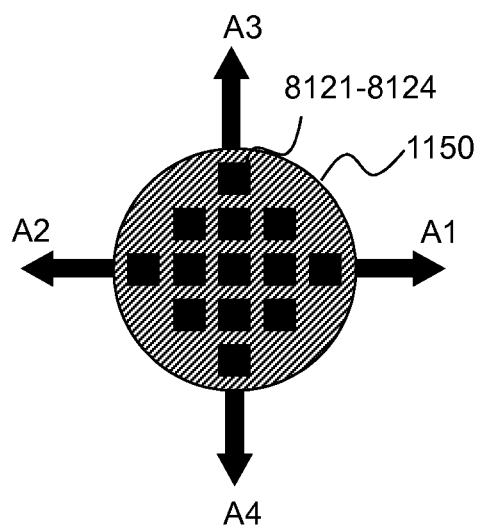
FIG. 4 schematically illustrates the operation of a stretching material in accordance with a further embodiment of this disclosure.
Figure 4:
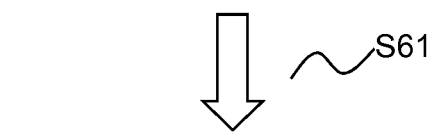
Figure 4:
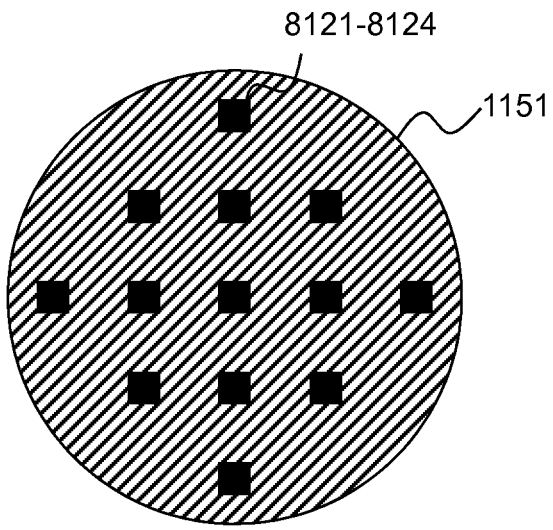

FIG. 4 schematically illustrates a possible operation of stretching material 1150 in accordance with an embodiment of this disclosure. In particular, FIG. 4 illustrates a top view of the stretching material 1150 that, in some embodiments, could be shaped so as to overlap with a wafer of size A, for instance, a 4-inch wafer. More specifically, stretching material 1150 can be stretched into any direction. In the specific example of FIG. 4, the stretching material 1150 is stretched in four directions as illustrated by arrows A1-A4, resulting into stretched material 1151 after stretching step S61, which, in some embodiments, could be shaped so as to overlap with a wafer of size B, for instance, an 8-inch wafer. The stretching could be carried out by clamps pulling with appropriate strength into the desired stretching direction, not illustrated, clamping the sides of the stretching material 1150, and application of pressure, or by thermal expansion of the stretching material 1150 or by any other suitable stretching means. The two-dimensional stretching operation of step S61 may, therefore, be used in step S21 described above to stretch from wafer with size A to wafer with size B.

Figure 5:
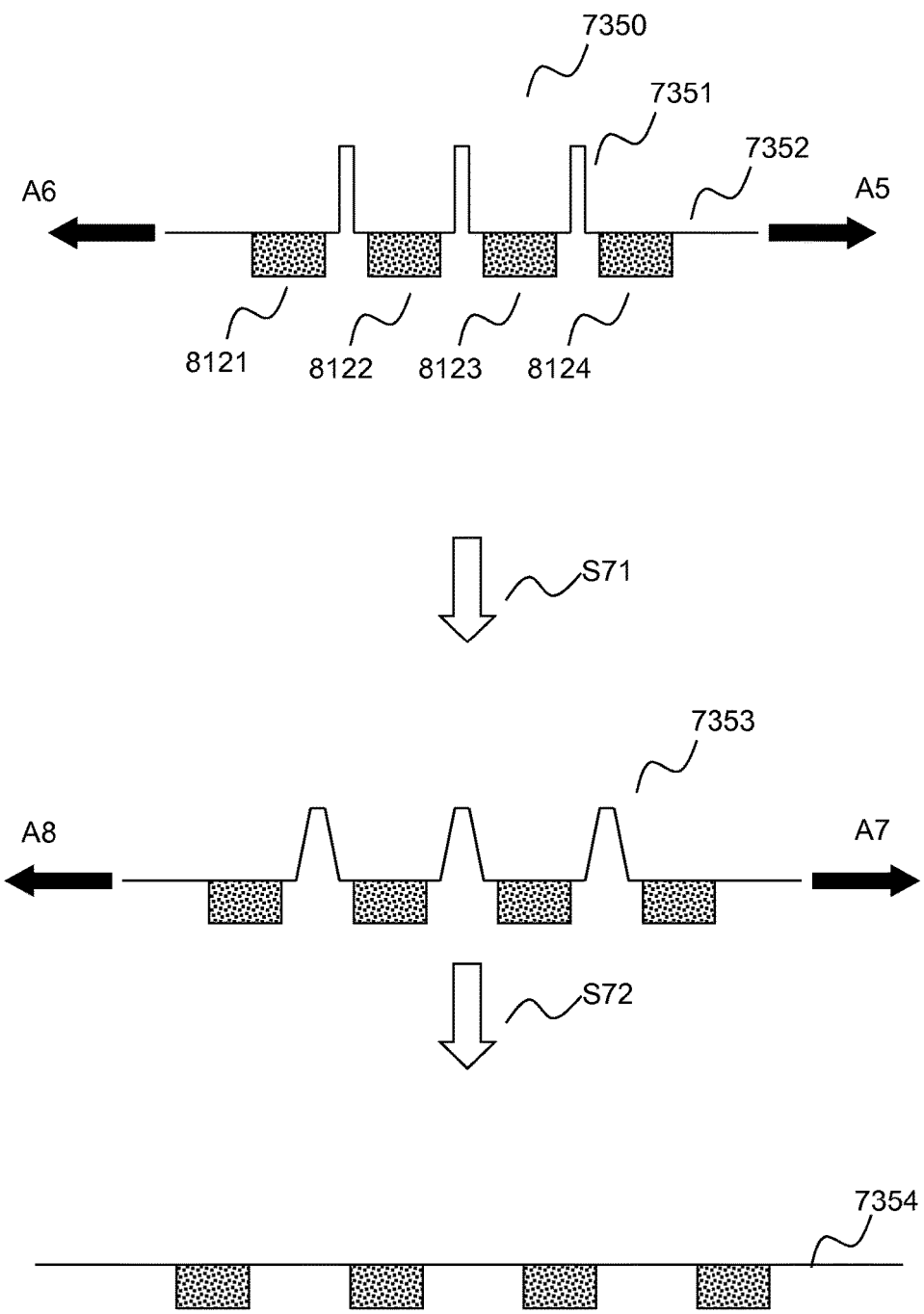
FIG. 5 schematically illustrates the operation of an alternative stretching material in accordance with a further embodiment of this disclosure.

FIG. 5 schematically illustrates the cut view and operation of a stretching material 7350 in accordance with a further embodiment of this disclosure. In particular, stretching material 7350 of FIG. 5 can be used as an alternative to the stretching material 1150. Stretching material 1150 or 7350 can be realized by different materials. In particular, stretching material 1150 or 7350 could be made of metal and/or polymer. In the case of stretching material 7350 being made of metal, appropriate cuts can be placed at the fold edges to be able to maintain folding in the horizontal and vertical direction of the stretching material, that is, in the two planar directions. In case of stretching material 7350 being made of polymer, an extra amount of matter placed at the fold edges leads to elasticity in the vertical and horizontal direction, for instance, thereby keeping the part of the polymer in contact with the cells unstretched. Both configurations, metal or polymer material used for the stretching material 7350, are advantageously of use whenever stress on the cell has to be avoided. This is specifically the case if the semiconductor layer 8120 is a thin and brittle layer. In alternative embodiments, a combination of several materials could be envisaged, for instance, metallic plates interconnected with polymer material. The cells are attached to the metallic plates and the polymer interconnection provides the elasticity necessary for the stretching operation. One can choose polymers that, after deformation due to stretching, can be reversibly deformed to the initial state, for example, by an appropriate heat treatment.

Stretching material 7350 schematically shows a plurality of vertical surfaces 7351 and a plurality of horizontal surfaces 7352 on which the plurality of cells 8121-8124 are placed. The vertical and horizontal surfaces can be connected by joints, or can be realized from a single bent element, or a combination of those two approaches, can be used. During a stretching step S71, the stretching material 7350 is stretched along directions A5 and A6, thereby resulting into partially stretched material 7353. As can be seen in FIG. 5, the vertical surfaces 7351 of stretching material 7350 move apart from each other, thereby resulting in the space between cells 8121-8124 to increase. During a plurality of stretching steps such as S71 and equivalent stretching step S72 along directions A7 and A8, the stretching material 7350 is stretched to a final position corresponding to stretched material 7354 in which the vertical surfaces 7351 have become horizontal, thereby becoming a prolongation of original horizontal surfaces 7352 with defined distance of the cells twice as large as the vertical surface 7351. Although not illustrated, the same two-dimensional stretching operation described in connection with FIG. 4 can also be used for stretching material 7350.

The advantage of using stretching material 7350 over stretching material 1150 consists in the fact that the stretching material 7350 does not need to be made of elastic material, thereby lowering costs and allowing for use of a wider range of material for the stretching material 1150. Furthermore, since the stretching material 7350 is stretched by moving vertical surfaces 7351, the lateral dimensions of horizontal surfaces 7352 remain unchanged. This provides the beneficial advantage of the contact surface between horizontal surfaces 7352 and cells 8121-8124 not being subjected to any stress due to the potential stretching of horizontal surfaces 7352, providing better support for fragile solar cell layers.

Although the stretched material 7354 is illustrated as completely flat, this disclosure is not limited thereto, and the stretching material may retain a non-flat profile at the end of the stretching process.

In further embodiments, one could envisage the use of the stretching material 1150 as a final substrate, the semiconductor structure corresponding to the stretched structure 1190 obtained by the stretching of the unstretched structure 1180 corresponding to the final solar cell assemblies. This could be advantageous in case of a complete multi junction solar cell stack obtained on substrate 8130, which has been provided in an inverted manner so as to have the lowest band gap junction exposed on which the stretching material could be applied. Application of a metallic type of stretching material, at least at the positions used to attach the cells, would lead to the stretched structure 1190 representing a multi junction solar cell stack on top of a metallic heat sink, thus forming a solar cell assembly that could be used and connected further in a solar cell module. In particular embodiments, the folds or joints of the metallic stretching material 7350 could be used as guidance for a subsequent separation step to individualize these solar cell assemblies.

Moreover, in alternative embodiments, the positions of the folds or joints could be used for alignment purposes with respect to the final positioning and assembling on the target substrate.

The invention claimed is:

1. A method for manufacturing a plurality of photovoltaic cells, the method comprising the steps of:
providing a photovoltaic layer on a substrate that is a wafer of size A;
cutting the photovoltaic layer thereby obtaining a plurality of photovoltaic cells, placed at a first distance from each other on top of the substrate;
attaching a stretching material to a top of the plurality of photovoltaic cells;
stretching the stretching material such that the plurality of photovoltaic cells results at a second distance from each other thereby resulting in a stretched material, wherein the second distance is greater that the first distance;
positioning the plurality of photovoltaic cells onto a target substrate that is a wafer of size B greater than size A, while the photovoltaic cells are still attached to the stretching material, after stretching the stretching material;
assembling the plurality of photovoltaic cells to the target substrate after the step of positioning the plurality of photovoltaic cells onto the target substrate; and
removing the stretched material from the plurality of photovoltaic cells after the step of positioning and before the step of assembling;
wherein the plurality of photovoltaic cells are attached to the stretching material and stretched from the initial size A of value 2 inches, 4 inches, 6 inches, or 8 inches to a respective larger size B of value 4 inches, 6 inches, 8 inches, or 12 inches.

2. The method of claim 1, wherein the step of assembling the plurality of photovoltaic cells to the target substrate comprises bonding the plurality of photovoltaic cells to the target substrate.

3. The method of claim 2, wherein the step of assembling further comprises bond preparation steps prior to bonding.

4. The method of claim 1, wherein the target substrate is a semiconductor substrate and comprises contacts to the plurality of photovoltaic cells.

5. The method of claim 1, further comprising the step of:
cutting the target substrate so as to realize a plurality of solar cell assemblies, each solar cell assembly comprising one of the plurality of photovoltaic cells.

6. The method of claim 5, further comprising the step of:
assembling the plurality of solar cell assemblies on a heat sink.

7. The method of claim 1, wherein the photovoltaic cells of the plurality of photovoltaic cells are multi junction III-V concentrator photovoltaic cells.

8. The method of claim 7, wherein the multi junction III-V concentrator photovoltaic cells are formed on a semiconductor substrate.

9. The method of claim 8, wherein the multi junction III-V concentrator photovoltaic cells have a thickness of several micrometers.

10. The method of claim 2, wherein bonding the plurality of photovoltaic cells to the target substrate comprises direct bonding or metal bonding the plurality of photovoltaic cells to the target substrate.

11. The method of claim 3, wherein the bond preparation steps comprise at least one of the following steps:
deposition of a conductive glue on at least one of the plurality of photovoltaic cells or the target substrate;
deposition of an adhesive on at least one of the plurality of photovoltaic cells or the target substrate;
deposition of a conductive intermediate layer on at least one of the plurality of photovoltaic cells or the target substrate; and
surface preparation by plasma treatment or chemical mechanical polishing.

12. The method of claim 8, wherein the semiconductor substrate comprises GaAs, InP, Ge or Si, and wherein the method further comprises removal of the semiconductor substrate and separation of the photovoltaic cells.

13. The method of claim 9, wherein the multi junction III-V concentrator photovoltaic cells have a thickness below 10 μm.

* * * * *

UNITED STATES PATENT AND TRADEMARK OFFICE
CERTIFICATE OF CORRECTION

PATENT NO. : 9,954,139 B2  
APPLICATION NO. : 14/780409  
DATED : April 24, 2018  
INVENTOR(S) : Krause et al.

Page 1 of 1

It is certified that error appears in the above-identified patent and that said Letters Patent is hereby corrected as shown below:

In the Specification

Column 2, Line 49, change "the pick and pick-and-place" to --the pick and place--

Signed and Sealed this  
Twenty-fourth Day of July, 2018

Andrei Iancu  
*Director of the United States Patent and Trademark Office*